United States Patent
Said

(10) Patent No.: US 9,128,119 B2
(45) Date of Patent: Sep. 8, 2015

(54) ELECTRICAL CIRCUIT TESTING

(71) Applicant: HAMILTON SUNDSTRAND CORPORATION, Windsor Locks, CT (US)

(72) Inventor: Waleed M. Said, Rockford, IL (US)

(73) Assignee: Hamilton Sundstrand Corporation, Windsor Locks, CT (US)

(*) Notice: Subject to any disclaimer, the term of this patent is extended or adjusted under 35 U.S.C. 154(b) by 161 days.

(21) Appl. No.: 13/853,525

(22) Filed: Mar. 29, 2013

(65) Prior Publication Data

US 2014/0292365 A1 Oct. 2, 2014

(51) Int. Cl.
G01R 1/04 (2006.01)
G01R 31/12 (2006.01)
G01R 31/00 (2006.01)
G01R 31/20 (2006.01)

(52) U.S. Cl.
CPC .......... *G01R 1/0416* (2013.01); *G01R 31/1227* (2013.01); *G01R 31/008* (2013.01); *G01R 31/20* (2013.01)

(58) Field of Classification Search
CPC .. G01R 1/0416; G01R 31/12; G01R 31/1227; G01R 31/2853; G01R 31/2882; G01R 31/14
USPC ........... 324/756.05, 522, 523, 756.01, 762.01
See application file for complete search history.

(56) References Cited

U.S. PATENT DOCUMENTS

| | | | |
|---|---|---|---|
| 4,663,585 A * | 5/1987 | Kruger et al. | 324/536 |
| 4,799,130 A * | 1/1989 | Emerson | 361/437 |
| 6,211,513 B1 * | 4/2001 | Brown et al. | 250/221 |
| 6,745,146 B1 * | 6/2004 | Brown et al. | 702/123 |
| 6,777,953 B2 * | 8/2004 | Blades | 324/532 |
| 2002/0079849 A1 * | 6/2002 | Mason et al. | 315/291 |
| 2002/0196031 A1 * | 12/2002 | Blades | 324/536 |
| 2003/0030446 A1 * | 2/2003 | Wang et al. | 324/525 |
| 2009/0256606 A1 * | 10/2009 | Matsumoto et al. | 327/172 |
| 2012/0056660 A1 * | 3/2012 | Yamada et al. | 327/434 |
| 2012/0313655 A1 * | 12/2012 | Bald et al. | 324/750.01 |

FOREIGN PATENT DOCUMENTS

| | | |
|---|---|---|
| EP | 1681575 A1 | 7/2006 |
| EP | 2506408 A2 | 10/2012 |
| WO | 9916159 A1 | 4/1999 |

OTHER PUBLICATIONS

EP Search Report for Application No. 14162283.7-1560 Mailed Jul. 31, 2014, 8 Pages.

* cited by examiner

*Primary Examiner* — Huy Q Phan
*Assistant Examiner* — David Frederiksen
(74) *Attorney, Agent, or Firm* — Cantor Colburn LLP

(57) ABSTRACT

An electronics system module includes a primary electrical circuit including input connectors and output connectors and a filter circuit connected between the primary electrical circuit and ground. The module also includes a switch element connected between the primary electrical circuit and ground. The switch element is configured to be engaged by a test connector to open the switch to disconnect the primary electrical circuit from ground. The test connector includes electrical connectors configured to connect to the input connectors and the output connectors of the primary electrical circuit. The switch element is configured to automatically close based on the test connector being disengaged from the switch element.

15 Claims, 5 Drawing Sheets

ELECTRICAL CIRCUIT TESTING

Embodiments of the invention relate to testing electrical circuits and in particular to a disconnection of electrical circuit from ground with a test connector and switch to perform electrical tests.

BACKGROUND OF THE INVENTION

Control units built to aerospace quality are often required to pass a dielectric test after being fabricated and prior to implementation in an aerospace environment. The dielectric test procedure entails applying high voltage in the range of 1500 V AC for a certain period of time to all mutually isolated terminals, and also from those terminals to the chassis that contains and encloses the printed circuit boards and circuit assemblies of the control unit. In many cases, filter circuits, such as lightning mitigating circuits and common mode filtering circuits and assemblies, are connected between the control units and ground or the chassis. The filtering circuits have relatively low impedance to the chassis potential. In order to pass the dielectric test, those circuits are typically removed from the printed circuit board or from the control box prior to conducting the dielectric test. Once the test is completed, those elements are reinstalled onto the printed circuit board or control box. This extra step in the manufacturing process is undesirable as it introduces manual labor to a process that is normally automated, increasing cost and the likelihood of errors.

BRIEF DESCRIPTION OF THE INVENTION

Embodiments of the invention relate to an electronics system module including a primary electrical circuit including input connectors and output connectors and a filter circuit connected between the primary electrical circuit and ground. The module also includes a switch element connected between the primary electrical circuit and ground. The switch element is configured to be engaged by a test connector to open the switch to disconnect the primary electrical circuit from ground. The test connector includes electrical connectors configured to connect to the input connectors and the output connectors of the primary electrical circuit. The switch element is configured to automatically close based on the test connector being disengaged from the switch element.

Embodiments of the invention also relate to a method for testing an electronics system module. The method includes connecting a test connector to an electronics system module, where the electronics system module includes a primary electrical circuit including signal inputs and signal outputs, a filter circuit connected between the primary electrical circuit and ground, and a switching element connected between the primary electrical circuit and ground. The test connector includes input connectors to connect to the signal inputs of a primary electrical circuit, output connectors to connect to the signal outputs of the primary electrical circuit and a switch connector to connect to the switching element. The switch connector is configured to turn off the switching element to disconnect the primary electrical circuit from ground. The method also includes performing a dielectric test on the electronics system module by applying a high AC voltage to the signal inputs and signal outputs of the primary electrical circuit.

Embodiments of the invention also relate to a circuit test unit configured to perform a dielectric test of an electronics system module. The electronics system module includes a primary electrical circuit, a filter circuit connected between the primary electrical circuit and ground, and a switching element connected between the primary electrical circuit and ground. The switching element is configured to selectively connect and disconnect the primary electrical circuit from ground. The circuit test unit includes input connectors configured to connect to signal inputs of a primary electrical circuit, output connectors configured to connect to signal outputs of the primary electrical circuit and a voltage source configured to apply a high AC voltage to the input connectors and the output connectors. The circuit test unit also includes a switching element connector configured to engage the switching element to turn off the switching element based on the test connector being connected to the electronics system module.

DETAILED DESCRIPTION OF THE INVENTION

For electrical circuits requiring dielectric testing, filter circuits between a primary electrical circuit and ground are removed prior to testing, resulting in additional manufacturing steps and manual interaction. Embodiments of the invention relate to a switch for disconnecting filter circuits from ground or a chassis prior to a dielectric test.

Figure 1:
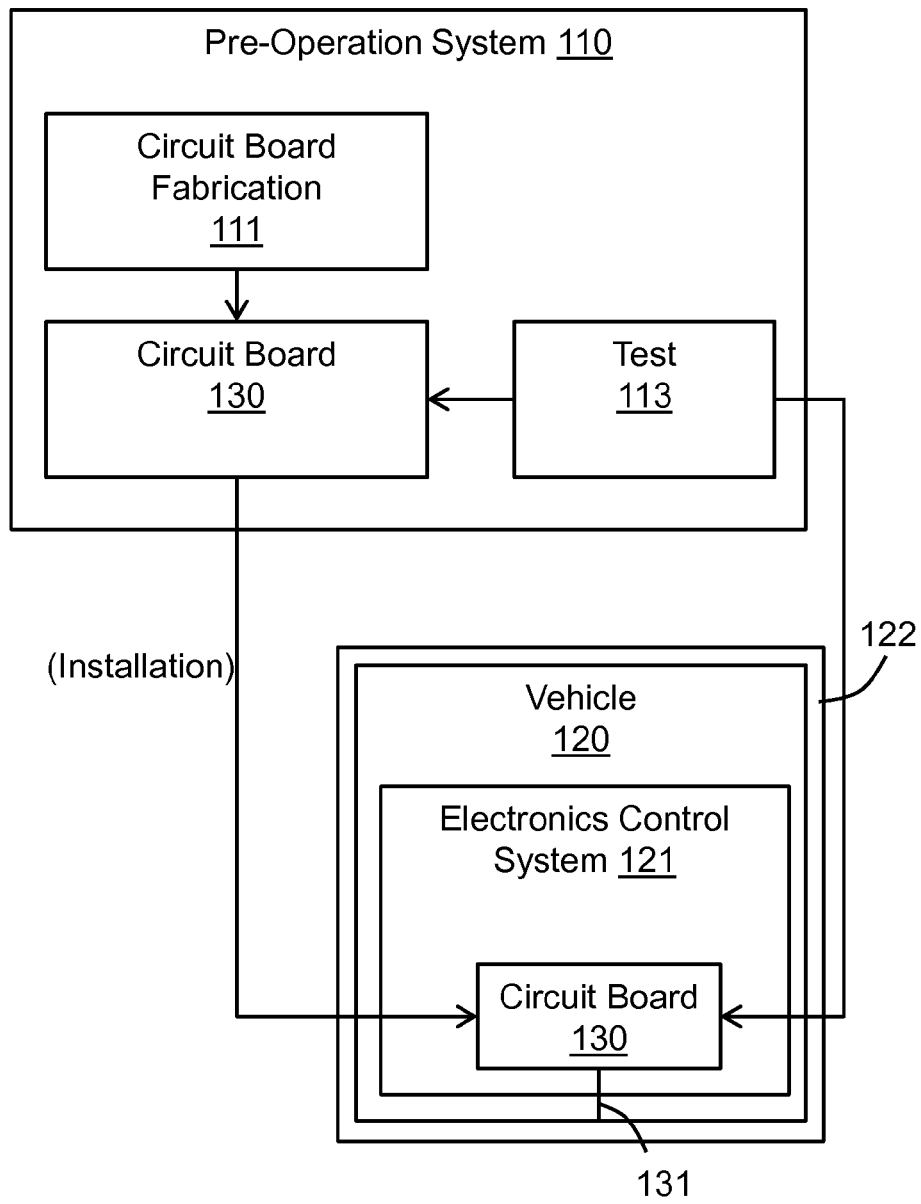
FIG. 1 illustrates a block diagram of a testing system according to one embodiment of the invention.

FIG. 1 illustrates a block diagram of a testing system according to an embodiment of the invention. A pre-operation system includes a process for fabricating a circuit board 111 and testing 113 the circuit board 130. The circuit board 130 is then installed in an electronics control system 121 of a vehicle 120. The circuit board 130 is electrically connected to the chassis 122 of the vehicle via a conductive connector 131, and the chassis 122 acts as electrical ground, referred to in the specification only as "ground." In embodiments of the invention, the electronics control system 121 is a controller or part of a control circuit that controls any system in the vehicle 120, including hydraulic systems, pneumatic systems, engine systems and electrical systems.

In embodiments of the invention, the test 113 includes a dielectric test or insulation resistance test. The dielectric test includes subjecting all of the mutually isolated terminals of the circuit board to a high voltage, such as 1500 V AC for a predetermined period of time. The dielectric test may be performed during pre-operation 110, before the circuit board 130 is connected to the electrical system 121, or after the circuit board is installed in the vehicle 120 and connected to the chassis 122. The insulation resistance test includes a similar process, but is typically performed by subjecting the mutually isolated terminals of the circuit board to a high DC voltage.

Figure 2:
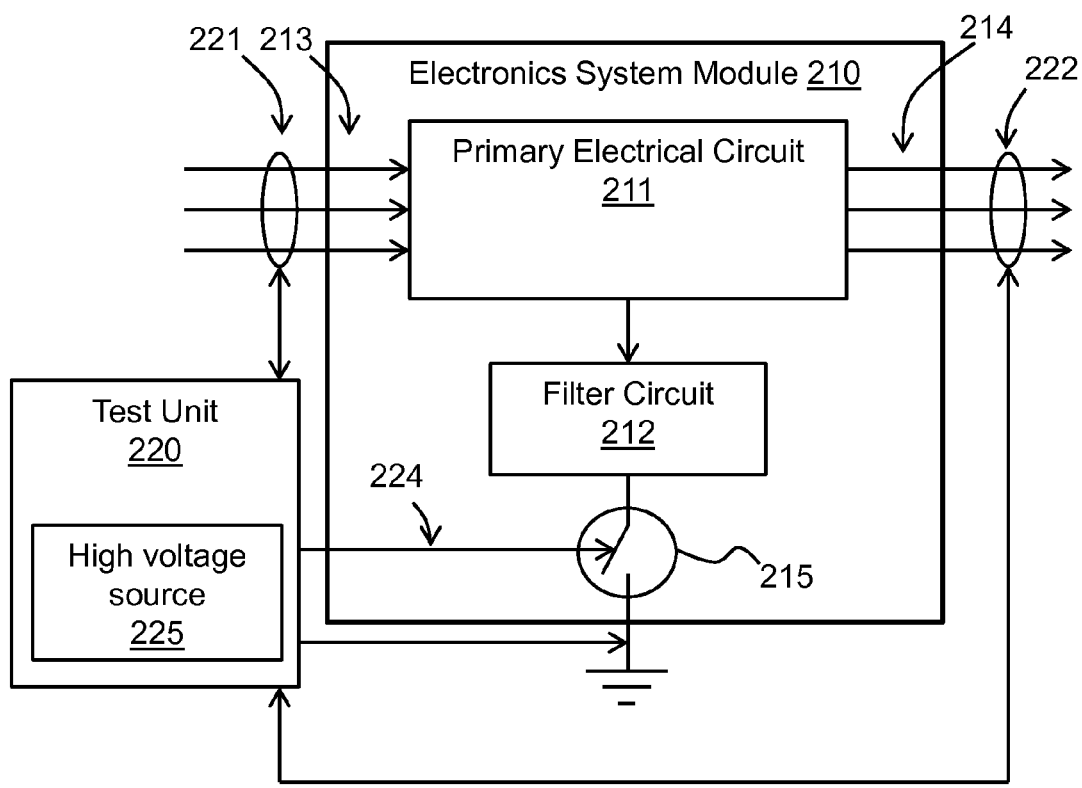
FIG. 2 illustrates a circuit board according to an embodiment of the invention.

FIG. 2 illustrates an example of an electronics system module 210 according to an embodiment of the invention. The electronics system module 210 corresponds to the circuit board 130 of FIG. 1, and may be, for example, a single printed circuit board. The electronics system module 210 includes a primary electrical circuit 211 and a filter circuit 212. In the present specification and claims, the term "primary electrical circuit" is used to distinguish control circuitry, logic and other processing circuitry, including processors, memory, logic circuits and other electrical circuitry configured to receive, process and transmit data, from the filter circuit 212 connected between the primary electrical circuit 211 and ground. In other words, the word "primary" is a distinguishing word, and does not infer a level of importance, an order of operation or any other hierarchal order. The primary electrical circuit 211 receives input signals from signal inputs 213, also referred to as inputs 213. The inputs 213 are represented as arrows in FIG. 2, but may include any physical electrical signal transmission structures, including pins, pads, wires, bumps, or any other conductive electrical signal transmission connection. The primary electrical circuit 211 outputs signals from the signal outputs 214, also referred to as outputs 214. While the inputs 213 and outputs 214 are illustrated as separate groups in FIG. 2, it is understood that some electrical connections may both receive and transmit signals. In addition, while one primary electrical circuit 211 is illustrated in FIG. 2, embodiments of the invention encompass any number of primary electrical circuits 211 on an electronics system module 210 in parallel or in series. Each separate primary electrical circuit may be connected to the filter circuit 212.

In one embodiment, the filter circuit 212 includes one or more resistor-capacitor (RC) filters connected in parallel with one or more Zener diodes or transient voltage suppression diodes, also referred to as transorbs, to limit voltage and/or current flow between the primary electrical circuit 211 and ground. In one embodiment, the filter circuit 212 is a lightning protection circuit connected between the primary electrical circuit 211 and a chassis, which acts as ground. During operation, when the electronics system module 210 is installed in a vehicle, such as an aircraft, the primary electrical circuit 211 is connected to a chassis of the vehicle, which acts as ground for the primary electrical circuit 211, as well as any other electrical circuits on the electrical circuit board 210 and any other electrical circuit boards in the vehicle. If a sudden high voltage event occurs, such as a lightning strike to the chassis of the vehicle, the filter circuit 212 protects the primary electrical circuit 211 from voltage or current surges.

In embodiments of the invention, a switch 215, also referred to as a switch element or switch circuit, is connected between the primary electrical circuit 211 and ground. While FIG. 2 illustrates the switch 215 between the filter circuit 212 and ground, embodiments of the invention also encompass the switch 215 being located between the primary electrical circuit 211 and the filter circuit 212. A test unit 220 includes input connectors 221, such as pins, pads, bumps, slots or other electrical connection structures that connect to the signal inputs 213. The test unit 220 also includes output connectors 222 that connect to the signal outputs 214, as indicated by reference numeral 222. The test unit 220 includes a switching element connector 224 that connects with the switch 215 to open the switch 215. In operation, during a test, a high voltage source 225 that applies a high AC voltage, such as 1500 V AC, to the signal inputs 213 and the signal outputs 214 via the input connectors 221 and the output connectors 222.

In embodiments of the invention, the switch 215 is a bidirectional switching element that is normally closed (ON) so as not to affect the performance of the primary electrical circuit 211. When the test unit 220 is connected to the electronics system module 210 via the high voltage terminals 221 and 222, and to the switch 215 via the switching element connector 224, the switch 215 automatically opens (OFF). Embodiments of the invention encompass any type of switch 215, including and analog switch, a relay, solid state switches or any other type of switch that is controlled by the test unit 220. For example, in an embodiment in which the switch 215 is an analog switch, the test unit 220 may include an engaging arm or latch that opens the switch 215 when the test unit 220 is connected to the electrical circuit board 210 and closes the switch 215, or allows the switch 215 to automatically revert to a closed position, when the test unit 220 is disconnected from the electrical circuit board 210. In an embodiment in which the switch 215 is a relay, the test unit 220 may include an electrical connection to supply power to the relay to close the switch 215 or to ground one side of the relay to close the switch, according to the design of the switch 215.

In one embodiment of the invention, the switch 215 may be automatically opened when the switching element connector 224 connects to the switch 215, and the switch 215 may automatically revert to a closed position when the switching element connector 224 is disengaged from the switch 215. In the present specification and claims, the term "automatically" means that no input from any user is required, beyond controlling the switching element connector 224 to engage and disengage the switch 215, to cause the switch 215 to turn on and off. In other words, once the switching element connector 224 is engaged with the switch 215, no additional controls signals are required to turn off the switch, and once the switching element connector 224 is disengaged from the switch 215, no additional control signals are required to turn on the switch 215.

Figure 3:
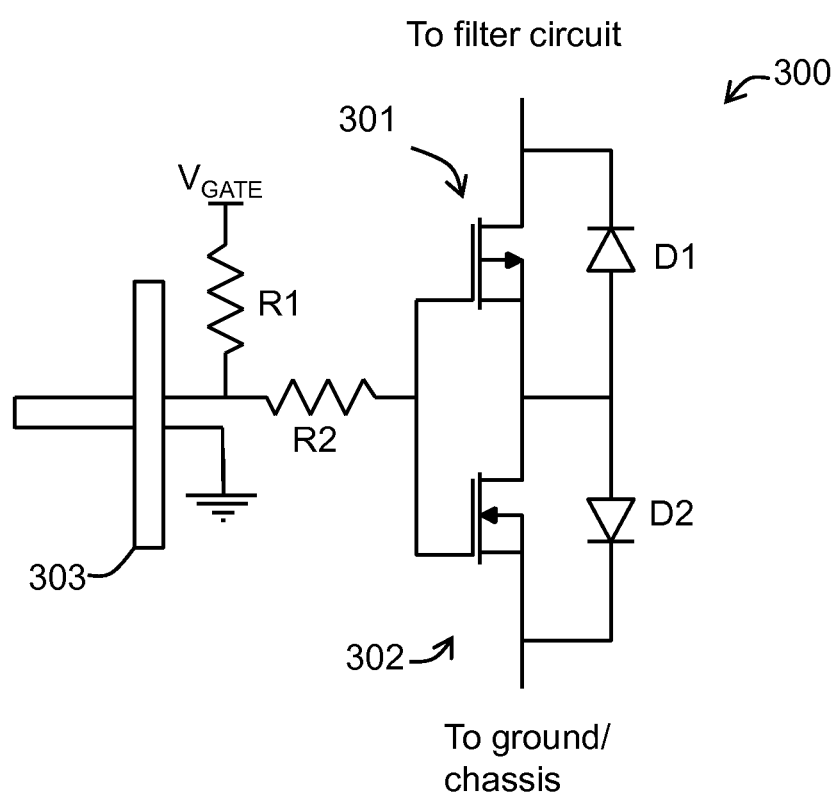
FIG. 3 illustrates a switch circuit according to an embodiment of the invention.

FIG. 3 illustrates a switching circuit 300 according to an embodiment of the invention. The switching circuit 300 includes first and second metal oxide semiconductor field effect transistors (MOSFETs) 301 and 302, first and second resistors R1 and R2 and first and second diodes D1 and D2 arranged in the manner illustrated in FIG. 3 between a filter circuit and ground, or a chassis. Alternatively, as discussed above, the switching circuit 300 may be connected between a primary electrical circuit and a filter circuit. In embodiments of the invention, the node at which R1 connects to R2 corresponds to the switching element connector 224 of FIG. 2. During normal operation, a voltage source supplies a gate voltage $V_{GATE}$, also referred to as an activation voltage, across the resistors R1 and R2 to the gates of the MOSFETs 301 and 302. This turns on the MOSFETs 301 and 302 to permit current flow, as desired or as necessary, between the filter circuit and ground or the chassis.

When a test connector 303 is connected to the switching circuit 300, the test connector 303 connects the gate voltage input line to ground, driving the gates of the MOSFETs 301 and 302 low to turn off the MOSFETs 301 and 302. Accordingly, the dielectric test may be performed on a primary electrical circuit connected to the filter circuit while disconnecting the primary electrical circuit from ground.

Figure 4:
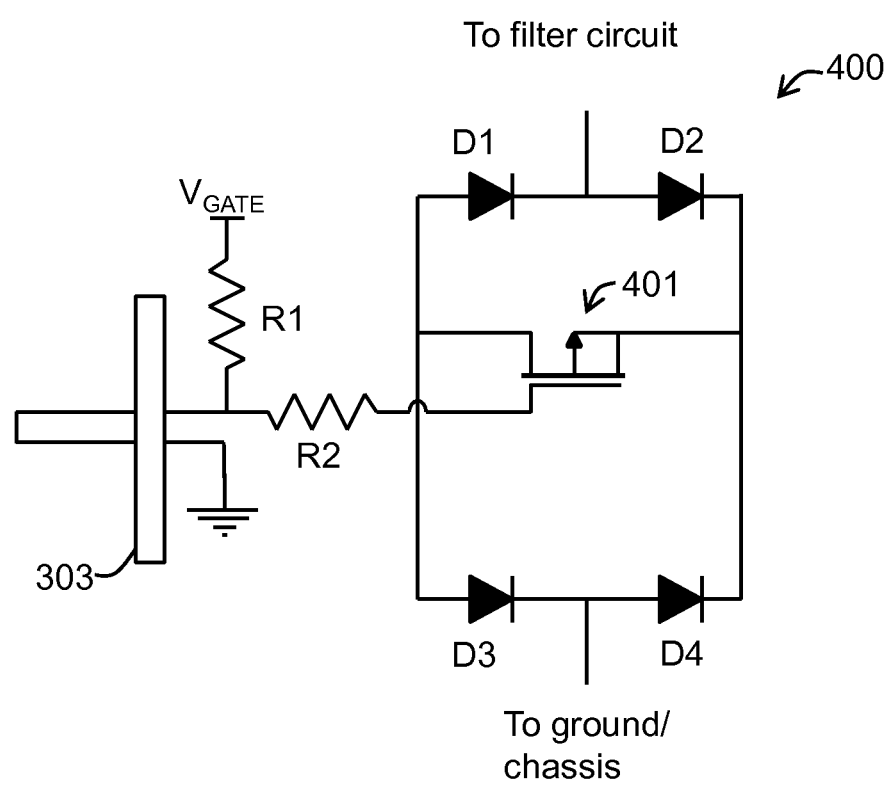
FIG. 4 illustrates a switch circuit according to another embodiment of the invention.

FIG. 4 illustrates a switching circuit 400 according to another embodiment of the invention. The switching circuit 400 includes a MOSFET 401, first and second resistors R1 and R2 and first to fourth diodes D1 to D4 arranged in the manner illustrated in FIG. 4 between a filter circuit and ground, or a chassis. Alternatively, as discussed above, the switching circuit 400 may be connected between a primary electrical circuit and a filter circuit. In embodiments of the invention, the node at which R1 connects to R2 corresponds to the switching element connector 224 of FIG. 2. During normal operation, a voltage source supplies a gate voltage $V_{GATE}$, also referred to as an activation voltage, across the resistors R1 and R2 to the gates of the MOSFET 401. This turns on the MOSFET 401 to permit current flow, as desired or as necessary, between the filter circuit and ground or the chassis.

When a test connector 303 is connected to the switching circuit 400, the test connector 303 connects the gate voltage input line to ground, driving the gate of the MOSFET 401 low to turn off the MOSFET 401. Accordingly, the dielectric test may be performed on a primary electrical circuit connected to the filter circuit while disconnecting the primary electrical circuit from ground.

In embodiments in which solid state switches are utilized, as in FIGS. 3 and 4, a leakage current of the solid state devices in the open position is coordinated to be much lower than the current allowed during the dielectric test. In an embodiment of the invention, the MOSFETs 301, 302 and/or 401 may be silicon carbine (SiC) MOSFETs having a low leakage current.

Figure 5:
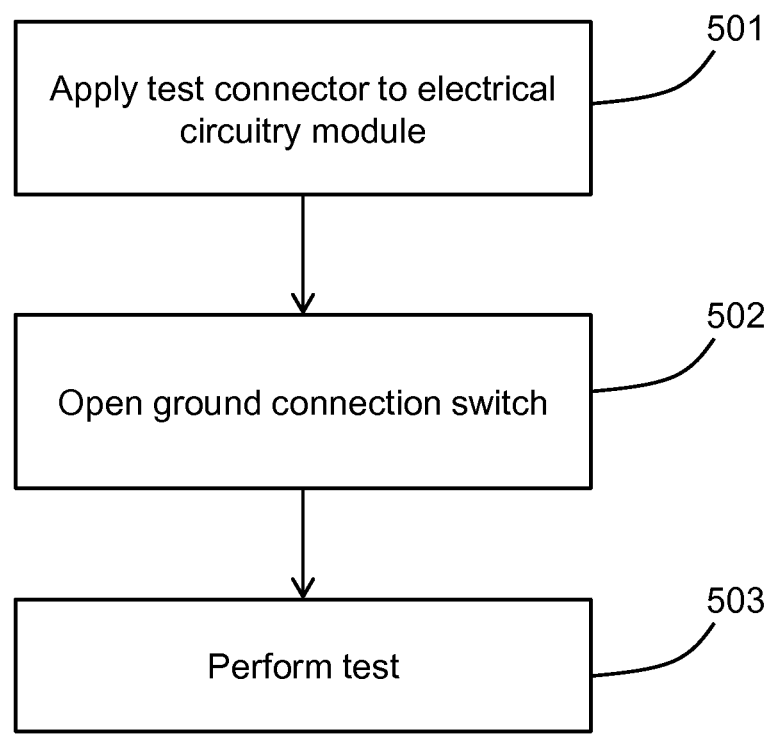
FIG. 5 is a flowchart illustrating a method according to an embodiment of the invention.

FIG. 5 is a flow diagram illustrating a method according to an embodiment of the invention. In block 501 a test connector of a circuit test unit is applied to an electronics system module. The electronics system module includes a primary electrical circuit and a filter circuit. The filter circuit is connected between the primary electrical circuit and ground, such as a chassis of a vehicle. The primary electrical circuit includes signal inputs and signal outputs, and the test connector connects to the signal inputs and outputs. The electronics system module also includes a switch between the filter and ground, or between the primary electrical circuit and the filter circuit. The test connector includes a pin or other connector to engage the switch to turn the switch off, disconnecting the primary electrical circuit from ground in block 502.

In block 503, a test is performed by applying a high voltage to the inputs and outputs of the primary electrical circuit with the circuit test unit. In one embodiment, a dielectric test is performed by applying a high AC voltage to the inputs and outputs of the primary electrical circuit. In another embodiment, an insulation resistance test is performed by applying a high DC voltage to the inputs and/or outputs of the primary electrical circuit. While the test is performed, the test connector remains engaged with the switch, and the switch stays open, or off. Upon completion of the test and removal of the circuit test unit, the switch returns to a closed, or on, position, connecting the primary electrical circuit to ground.

In embodiments of the invention, a switch or switch circuit is provided between a primary electrical circuit and ground that automatically turns off upon contact with a test connector to separate the primary electrical circuit from ground during a test. Accordingly, human interaction with a circuit board and circuit components is reduced in the testing and fabrication process, reducing the possibility of testing or fabrication errors.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics system module, comprising:
    a primary electrical circuit including input connectors and output connectors;
    a filter circuit connected between the primary electrical circuit and ground; and
    a switch element connected between the primary electrical circuit and the ground,
    wherein the switch element is configured to be engaged by a test connector to open the switch to disconnect the primary electrical circuit from the ground,
    wherein the test connector includes electrical connectors configured to connect to the input connectors and the output connectors of the primary electrical circuit,
    wherein the test connector is configured to connect a gate of a component of the switch element to the ground to disconnect the primary electrical circuit from the ground and enable a dielectric test on the primary electrical circuit while the primary electrical circuit is disconnected from the ground, and
    wherein the switch element is configured to automatically close based on the test connector being disengaged from the switch element.

2. The electronics system module of claim 1, wherein the switch element is one of an analog switch and a relay.

3. The electronics system module of claim 1, wherein the switch element is configured to receive an activation voltage from the primary electrical circuit to maintain the switch in an ON state, and
    the test connector is configured to open the switch by driving the activation voltage to the ground.

4. The electronics system module of claim 1, wherein the switch element is located between the primary electrical circuit and the filter circuit.

5. The electronics system module of claim 1, wherein the switch element is located between the filter circuit and the ground.

6. The electronics system module of claim 1, wherein the filter circuit includes one or more resistor-capacitor filters connected in parallel with one or more Zener diodes or transorbs.

7. The electronics system module of claim 1, wherein the switch element includes first and second metal oxide semiconductor field effect transistors (MOSFETs) connected source-to drain, a gate of each of the first and second MOSFETs connected to an activation voltage source, and the gates of each of the first and second MOSFETs configured to be selectively connected to the test connector, the test connector configured to connect the gates of the first and second MOSFETs to the ground to turn off the first and second MOSFETs and disconnect the primary electrical circuit from the ground, and
    wherein the component is a plurality of components including the first and second MOSFETs and the gate of the component is the gate of each of the first and second MOSFETs connected to the activation voltage source.

8. The electronics system module of claim 1, wherein the switch element includes a diode bridge circuit including a metal oxide field effect transistor (MOSFET) having a gate connected to an activation voltage source configured to maintain the MOSFET in an ON state to connect the primary electrical circuit to the ground, the gate of the MOSFET configured to be selectively connected to the test connector, the test connector configured to connect the gate to the ground to turn off the MOSFET and disconnect the primary electrical circuit from the ground, and
    wherein the component is the MOSFET and the gate of the component is the gate connected of the MOSFET to the activation voltage source.

9. The electronics system module of claim 1, wherein the ground is the chassis of a vehicle, and the filter circuit is a lightning protection circuit configured to protect the primary electrical circuit from a voltage surge on the chassis.

10. A method for testing an electronics system module comprising:

connecting a test connector to an electronics system module, the electronics system module including a primary electrical circuit including signal inputs and signal outputs, a filter circuit connected between the primary electrical circuit and the ground, and a switching element connected between the primary electrical circuit and the ground, the test connector including input connectors to connect to the signal inputs of a primary electrical circuit, output connectors to connect to the signal outputs of the primary electrical circuit and a switch connector to connect to the switching element, the switch connector configured to turn off the switching element to disconnect the primary electrical circuit from the ground;

connecting, by the test connector, a gate of a component of the switch element to the ground to disconnect the primary electrical circuit from the ground; and performing a dielectric test on the electronics system module by applying a high AC voltage to the signal inputs and signal outputs of the primary electrical circuit while the primary electrical circuit is disconnected from the ground.

11. The method of claim 10, wherein the switch connector automatically turns off the switching element upon being connected to the switching element.

12. The method of claim 10, wherein the switching element is configured to receive an activation voltage from the primary electrical circuit to maintain the switching element in an ON state, and the switch connector of the test connector is configured to drive the activation voltage to the ground to turn off the switching element.

13. The method of claim 10, further comprising:

disconnecting the test connector from the electronics system module based on completing the dielectric test, wherein the switching element is configured to automatically turn on based on the switch connector being disconnected from the switching element.

14. A circuit test unit configured to perform a dielectric test of an electronics system module, the electronics system module including a primary electrical circuit, a filter circuit connected between the primary electrical circuit and ground, and a switching element connected between the primary electrical circuit and the ground configured to selectively connect and disconnect the primary electrical circuit from the ground, the circuit test unit comprising:

input connectors configured to connect to signal inputs of a primary electrical circuit;

output connectors configured to connect to signal outputs of the primary electrical circuit;

a voltage source configured to apply a high AC voltage to the input connectors and the output connectors; and a switching element connector configured to engage by a test connector to turn off the switching element based on the test connector being connected to the electronics system module, wherein the test connector is configured to connect a gate of a component of the switch element to the ground to disconnect the primary electrical circuit from the ground and enable a dielectric test on the primary electrical circuit while the primary electrical circuit is disconnected from the ground.

15. The circuit test unit of claim 14, wherein the switching element in maintained on by an activation voltage, and the switching element connector includes a connection to the ground to automatically drive the activation voltage to the ground based on the switching element connector being connected to the switching element, such that the switching element is automatically turned on based on the switching element connector being disconnected from the switching element.

* * * * *